United States Patent
Osterheld et al.

(10) Patent No.: US 6,561,381 B1
(45) Date of Patent: May 13, 2003

(54) CLOSED LOOP CONTROL OVER DELIVERY OF LIQUID MATERIAL TO SEMICONDUCTOR PROCESSING TOOL

(75) Inventors: Thomas H. Osterheld, Mountain View, CA (US); Benjamin A. Bonner, San Mateo, CA (US); Michael W. Richter, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 183 days.

(21) Appl. No.: 09/717,720

(22) Filed: Nov. 20, 2000

(51) Int. Cl.$^7$ .................................................. B67B 7/00
(52) U.S. Cl. .............................. 222/1; 222/58; 222/61; 222/335; 222/399
(58) Field of Search ............................... 222/1, 56, 58, 222/61, 335, 399

(56) References Cited

U.S. PATENT DOCUMENTS

| | | | |
|---|---|---|---|
| RE32,102 E | * 4/1986 | Ricciardi et al. | 222/56 |
| 5,357,306 A | * 10/1994 | Skye et al. | 222/58 |
| 5,478,435 A | 12/1995 | Murphy et al. | 156/636.1 |
| 5,636,762 A | * 6/1997 | Juhola et al. | 137/205 |
| 5,750,440 A | 5/1998 | Vanell et al. | 438/692 |
| 5,857,893 A | 1/1999 | Olsen et al. | 451/5 |
| 6,098,843 A | 8/2000 | Soberanis et al. | 222/53 |

\* cited by examiner

Primary Examiner—Gene Mancene
Assistant Examiner—Melvin A Cartagena
(74) Attorney, Agent, or Firm—Townsend and Townsend and Crew

(57) ABSTRACT

Liquid material is precisely dispensed to a semiconductor processing tool utilizing closed loop control. In one embodiment, CMP slurry material of known density is supplied from a reservoir/mixing vessel to a dispense module. The dispense module also receives a flow of an inert gas through a gas supply valve. Positive pressure arising within the dispense module due to the inert gas flow causes an outflow of slurry from the dispense module to the CMP platen. The rate of flow of the slurry to the CMP platen over time is determined by monitoring the change (decline) in weight of the filled dispense module. In a similar manner, variation in the rate of flow of slurry over time may be detected by monitoring variation in changes in weight of the filled dispense module over time. A regulator structure in electronic communication with the dispense module and with the gas supply valve receives first signals at different time points indicating the weight change of the dispense module. In response, the regulator structure communicates a second signal to the gas supply valve, reflecting an appropriate change in the rate of flow of CMP slurry material to the platen. This second signal causes the gas supply valve to vary the flow of inert gas to the dispense module in order to control changes in the flow rate of the slurry.

8 Claims, 1 Drawing Sheet

CLOSED LOOP CONTROL OVER DELIVERY OF LIQUID MATERIAL TO SEMICONDUCTOR PROCESSING TOOL

BACKGROUND OF THE INVENTION

The present invention relates to a method for controlling delivery of liquid material to a semiconductor processing tool utilized in semiconductor processing.

Dispensing of slurry material to a platen of a chemical-mechanical polishing (CMP) tool from a delivery module is typically controlled by timed flow of material at a rate that is generally assumed to be constant. However, the assumption of an unvarying flow rate is often not accurate, due to issues such as partial obstruction of valves and tubing by viscous slurry material, and uneven pumping action by pumps.

Uneven flow rates over time can lead to inaccurate dispensing of CMP slurry to the platen. Often, this problem is addressed by utilizing an overly high flow rate to ensure that ample slurry is present on the platen. However, oversupply of CMP slurry needlessly increases the cost of the process by consuming excessive slurry material. This problem is exacerbated by the short lifetime of mixed slurry, which requires that the slurry be consumed shortly after its preparation from individual components It is therefore desirable that structures and methods for precise dispensing of CMP slurry material during processing be developed.

SUMMARY OF THE INVENTION

In accordance with embodiments of the present invention, dispensing of slurry material to a CMP platen during processing is precisely metered utilizing closed loop control. Slurry material of known density is first supplied from a reservoir/mixing vessel to a dispense module. The dispense module receives a flow of an inert gas through a gas supply valve. Positive pressure arising within the dispense module due to the inert gas flow causes an outflow of slurry from the dispense module to the CMP platen. The rate of flow of the slurry to the CMP platen over time is determined by monitoring the change in weight of the filled dispense module. In a similar manner, variation in the rate of flow of slurry over time may be detected by monitoring weight change of the filled dispense module. A flow regulator structure in electronic communication with the dispense module and with the gas supply valve receives a first signal indicating the weight change of the dispense module. In response, the flow regulator structure communicates a second signal to the gas supply valve reflecting a change in the rate of flow of CMP slurry material to the platen. This second signal causes the gas supply valve to alter the flow of inert gas to the dispense module in order to correct for changes in the slurry flow rate.

An apparatus for dispensing material to a semiconductor processing tool in accordance with one embodiment of the present invention comprises a dispense module including a first port, a second port, and a third port, the first port in fluid communication with a reservoir and the second port in fluid communication with the semiconductor processing tool. A load cell measures a weight of the dispense module. A gas supply valve is in communication with a pressurized inert gas supply and with the third port of the dispense module. A flow regulator is in electronic communication with the load cell and in communication with the gas supply valve. The flow regulator is configured to receive a first signal from the load cell indicating the weight of the dispense module. The flow regulator is also configured to transmit a second signal to the gas supply valve. The second signal changes a state of the gas supply valve to correct a rate of flow of a processing material from the dispense module to the semiconductor processing tool.

A method for dispensing material to a semiconductor processing tool in accordance with one embodiment of the present invention comprises providing the material within a dispense module, and flowing an inert gas into the dispense module through a gas supply valve such that the material flows from the dispense module to the semiconductor processing tool. A flow rate of the material from the dispense module is detected by monitoring a weight change of the dispense module. Based upon the weight change of the dispense module, a signal is generated to alter the material flow rate. The signal is communicated to the gas supply valve to adjust the gas supply valve to compensate for one of an excessive material flow rate and an insufficient material flow rate.

These and other embodiments of the present invention, as well as its advantages and features are described in more detail in conjunction with the text below and the attached FIGURE.

DESCRIPTION OF THE SPECIFIC EMBODIMENTS

Figure 1:
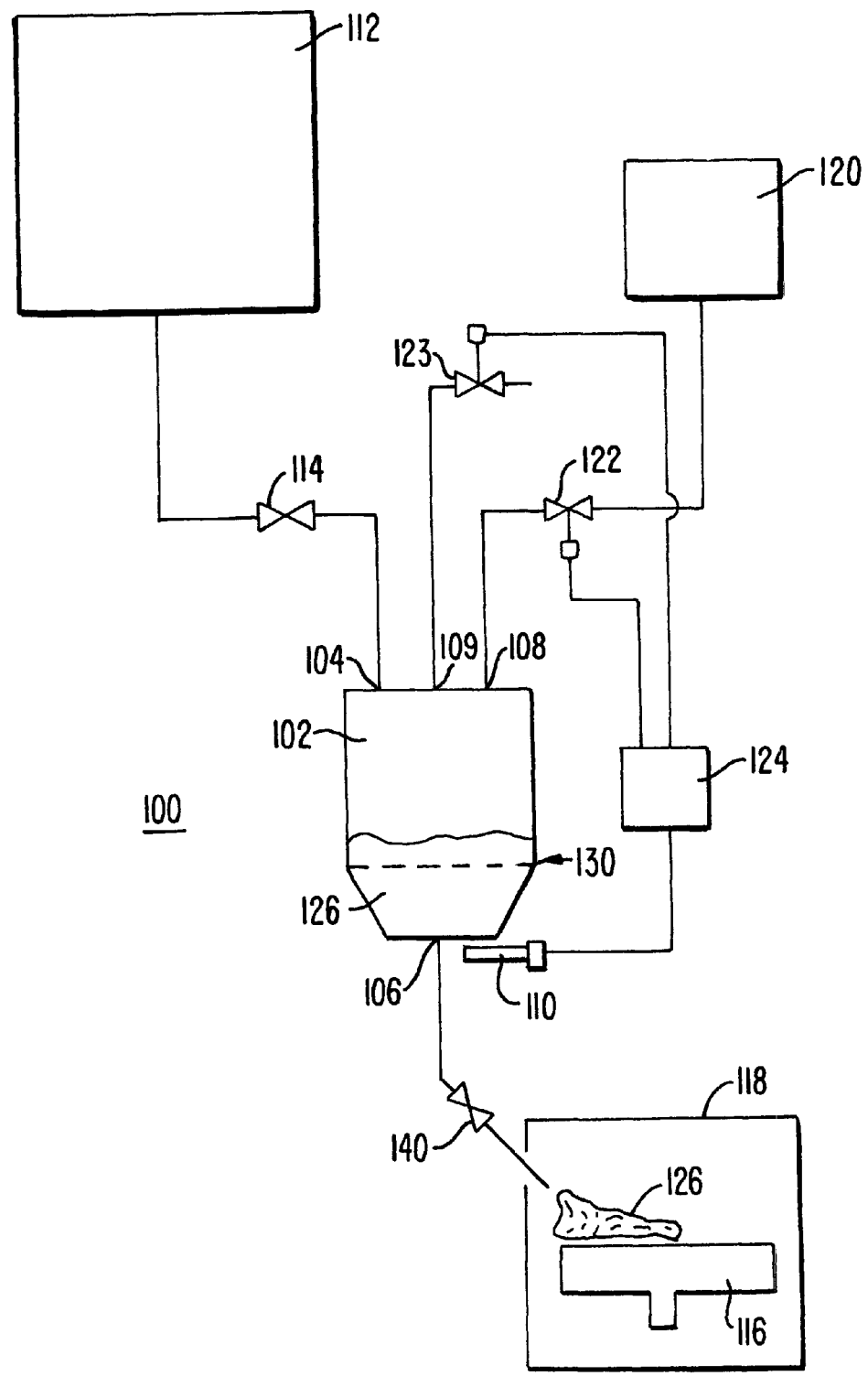
FIG. 1 shows a simplified schematic view of an apparatus for closed-loop control over CMP slurry dispensing in accordance with one embodiment of the present invention.

FIG. 1 shows a simplified schematic view of an apparatus for closedloop control over CMP slurry dispensing in accordance with one embodiment of the present invention.

Closed loop CMP slurry delivery system 100 comprises dispense module 102 including first port 104, second port 106, third port 108, and fourth port 109. The weight of dispense module 102 is measured by load cell 110. While the weight of dispense module 102 is shown as being determined by a single load cell 110, in alternative embodiments in accordance with the present invention more than one load cell could be used for this purpose.

First port 104 of dispense module 102 is in fluid communication with slurry reservoir/mixer 112 through material supply valve 114. Second port 106 of dispense module 102 is in fluid communication with platen 116 of CMP tool 118 through on-off valve 140. Third port 108 of dispense module 102 is in fluid communication with pressurized inert gas supply 120 through gas supply valve 122. Fourth port 109 of dispense module 102 is in fluid communication with the external environment through pressure release valve 123.

Flow regulator 124 is in electrical communication with load cell 110, gas supply valve 122, and pressure release valve 123.

During operation of CMP tool 118, dispense module 102 is initially empty. The empty weight of dispense module 102 is registered by load cell 110 and communicated to flow regulator 124.

Material supply valve 114 is opened and slurry material 126 is flowed from reservoir/mixer 112 through first port 104 into dispense module 102. The weight of the filled dispense module 102 is then registered by load cell 110. Because the density of the slurry material is already known, the amount of slurry material present in the dispense module can readily be precisely calculated.

Next, gas supply valve 122 is opened, and inert gas flows into third port 108 of dispense module 102 from inert gas supply 120. As a result of the inflow of inert gas into dispense module 102, a positive pressure is created within dispense module 102 that in turn causes a flow of liquid slurry material 126 from second port 106 of dispense module 102 to CMP platen 116.

The rate of flow of liquid slurry material from dispense module 102 to platen 116 of CMP tool I 18 may be determined from first timed signals sent by load cell 110 to flow regulator 124. Specifically, these signals reflect the weight of the filled dispense module 126 at two different times, such that change in weight of module 102 over a time period can be determined by flow regulator 124.

In response to the detected change in weight of the filled dispense module 102, flow regulator 124 transmits a second signal to vary the state of gas supply valve 122. Where the first signal has revealed a change in weight of the dispense module indicative of an excessive slurry flow rate, the second signal is calculated to restrict the supply of inert gas flowing through gas supply valve. This will in turn decrease pressure within the dispense module, reducing the rate of flow of slurry from the dispense module to the platen. Because pressure in the dispense module may decrease only slowly in response to a restricted inlet flow of gas, module 102 is also equipped with pressure release valve 123 that can be activated by flow regulator 124 to rapidly lower the pressure in module 102.

Conversely, where the first signal has revealed a change in weight of the dispense module indicative of an insufficient slurry flow rate, the second signal is calculated to enlarge the supply of inert gas flowing through gas supply valve. This will in turn increase pressure within the dispense module, elevating the rate of flow of slurry from the dispense module to the platen.

Where the first signal has revealed a change in weight of the dispense module indicative of the desired flow rate, no second signal is communicated to the gas supply valve, and the state of this valve remains unchanged.

Once the level of slurry present in the dispense module 102 falls below a predetermined level 130, an alarm is sounded to indicate the necessity of refilling the dispense module 102 from slurry reservoir/mixer 112. The user may similarly be alerted where changes in the flow rate of slurry from the dispense module indicate serious problems such as stoppages (little or no slurry flow) or leaks (excessively high slurry flow).

One important aspect of the present invention is that the actual rate of slurry flow is continuously measured, with no assumption made as to constant slurry flow. This approach permits precise amounts of slurry to be delivered to the CMP tool, maximizing efficient use of this costly consumable material.

Precise metering of slurry flow in accordance with embodiments of the present invention also results in minimum delay between the transfer of slurry from a reservoir/mixer and the actual dispensing of slurry to the CMP tool, allowing the prepared slurry to be maintained in the reservoir prior to allocation to the dispensing vessel without degradation for a minimum time period. This is important insofar as slurry material typically has a limited shelf life and requires mixing of its respective components shortly before being dispensed to the platen.

Another aspect of methods and structures for controlling slurry flow in accordance with the present invention is the avoidance of use of active sensor structures to detect the rate of slurry flow.

Several varieties of active flow sensors exist, including but not limited to paddlewheels, pressure transducers, or ultrasonic flow velocity sensors. However, each of these sensor types poses certain disadvantages. For example, paddlewheels are prone to clogging due to the high viscosity and particle count of the slurry. Ultrasonic sensors are effective but relatively complex and expensive to operate. All types of active flow sensors contain component parts that are subject to wear and which must be replaced periodically.

Issues relating to active flow sensors are avoided in embodiments of the present invention by controlling flow rates indirectly through monitoring weight change of the dispense module. As a result, liquid delivery devices in accordance with embodiments of the present invention both more reliable and more economical than conventional liquid delivery systems that utilize active flow sensors.

While the above is a full description of specific embodiments in accordance with the present invention, various modifications, alternative constructions and equivalents may be used. For example, while the above description relates to an apparatus wherein the flow regulator alters the state of the gas supply valve and/or pressure release valve by emitting a second signal in electrical form, this is not required by the present invention. In alternative embodiments, the flow regulator could control the state of the gas supply/pressure release valves pneumatically or hydraulically rather than electrically, and apparatuses and methods for dispensing liquid material would remain within the scope of the present invention. In such alternative embodiments, the signal communicated from the regulator to the gas supply valve would be a change in one of air pressure, water pressure, or oil pressure where hydraulic oils are used.

In addition, while the above description relates to a closed loop method for dispensing a slurry material to a platen of a CMP tool, the present invention is not limited to this particular application. A system or method in accordance with embodiments of the present invention could deliver other liquids utilized during semiconductor processing, including but not limited to undeveloped photoresist material utilized in lithography processes, or corrosive liquid chemicals utilized in etching processes.

Given the variety of embodiments of the present invention just described, the above description and illustrations should not be taken as limiting the scope of the present invention which is defined by the appended claims.

What is claimed is:

1. A method for dispensing material to a semiconductor processing tool, the method comprising:

providing the material within a dispense module;

flowing an inert gas into the dispense module through a gas supply valve, such that the material flows from the dispense module to the semiconductor processing tool;

detecting a flow rate of the material from the dispense module by monitoring a weight change of the dispense module;

generating a signal to vary the material flow rate; and communicating the signal to the gas supply valve to adjust the gas supply valve to vary the material flow rate.

2. The method according to claim 1 further comprising communicating the signal to a pressure release valve in communication with the dispense module and an environment, in response to an excessive material flow rate.

3. The method according to claim 1 wherein communicating the signal comprises communicating an electrical signal to the gas supply valve.

4. The method according to claim 1 wherein communicating the signal comprises communicating an air pressure signal to the gas supply valve.

5. The method according to claim 1 wherein communicating the signal comprises communicating a liquid pressure signal to the gas supply valve.

6. The method according to claim 1 wherein providing the material to the delivery module comprises providing chemical-mechanical polishing slurry.

7. The method according to claim 1 wherein providing the material to the delivery module comprises providing undeveloped photoresist.

8. The method according to claim 1 wherein providing the material to the delivery module comprises providing wet etchant chemistry.

* * * * *